(12) United States Patent
Langhammer

(10) Patent No.: US 8,347,192 B1
(45) Date of Patent: Jan. 1, 2013

(54) PARALLEL FINITE FIELD VECTOR OPERATORS

(75) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 335 days.

(21) Appl. No.: 12/719,770

(22) Filed: Mar. 8, 2010

(51) Int. Cl.
*H03M 13/00* (2006.01)

(52) U.S. Cl. ........................................ 714/784

(58) Field of Classification Search ............ 714/781, 714/784
See application file for complete search history.

(56) References Cited

U.S. PATENT DOCUMENTS

| | | | |
|---|---|---|---|
| 5,343,426 A | 8/1994 | Cassidy et al. | |
| 5,459,742 A | 10/1995 | Cassidy et al. | |
| 6,014,767 A * | 1/2000 | Glaise | 714/776 |
| 6,694,476 B1 | 2/2004 | Sridharan et al. | |
| 6,738,942 B1 | 5/2004 | Sridharan et al. | |
| 6,810,499 B2 | 10/2004 | Sridharan et al. | |
| 7,028,247 B2 * | 4/2006 | Lee | 714/784 |
| 7,032,162 B1 * | 4/2006 | Dhamankar | 714/784 |
| 7,103,830 B1 | 9/2006 | Dong | |
| 7,162,679 B2 * | 1/2007 | Liberol et al. | 714/759 |
| 7,178,091 B1 * | 2/2007 | Alon | 714/784 |
| 7,366,969 B2 * | 4/2008 | Dong et al. | 714/784 |
| 7,376,917 B1 | 5/2008 | Lazarut et al. | |
| 7,559,007 B1 | 7/2009 | Wilkie | |
| 2009/0199075 A1 * | 8/2009 | Demjanenko et al. | 714/784 |
| 2009/0216910 A1 | 8/2009 | Duchesneau | |

\* cited by examiner

*Primary Examiner* — James C Kerveros
(74) *Attorney, Agent, or Firm* — Weaver Austin Villeneuve & Sampson LLP

(57) ABSTRACT

Parallel Reed Solomon error correction can be performed using dot products in finite fields while factoring out multiplier reduction. A finite field accumulator with left and right shifts of the polynomial dot products is used to generate the final result using a fixed dot product core and a small number of post processing Galois Field multiplies. An efficient Reed Solomon decoder for transmission, storage, and processing operations can be implemented in a small area while being easily scalable.

18 Claims, 6 Drawing Sheets

PARALLEL FINITE FIELD VECTOR OPERATORS

TECHNICAL FIELD

The present disclosure relates to parallel finite field vector operators for applications such as error correction.

DESCRIPTION OF RELATED ART

Reed Solomon error correction involves oversampling a polynomial corresponding to a data set and transmitting or storing the oversampled values. A receiver or decoder can retrieve the data set as long as a sufficient number of values can be recovered. Reed Solomon codes are used in a variety of applications including optical storage, data center, broadband, and broadcast applications.

Increasing communications, storage, and processing demands require ever more efficient error correction, including Reed Solomon forward error correction. Consequently, it is desirable to provide improved mechanisms for implementing error correction.

BRIEF DESCRIPTION OF THE DRAWINGS

The disclosure may best be understood by reference to the following description taken in conjunction with the accompanying drawings, which illustrate particular embodiments of the present invention.

DESCRIPTION OF PARTICULAR EMBODIMENTS

Figure 1:
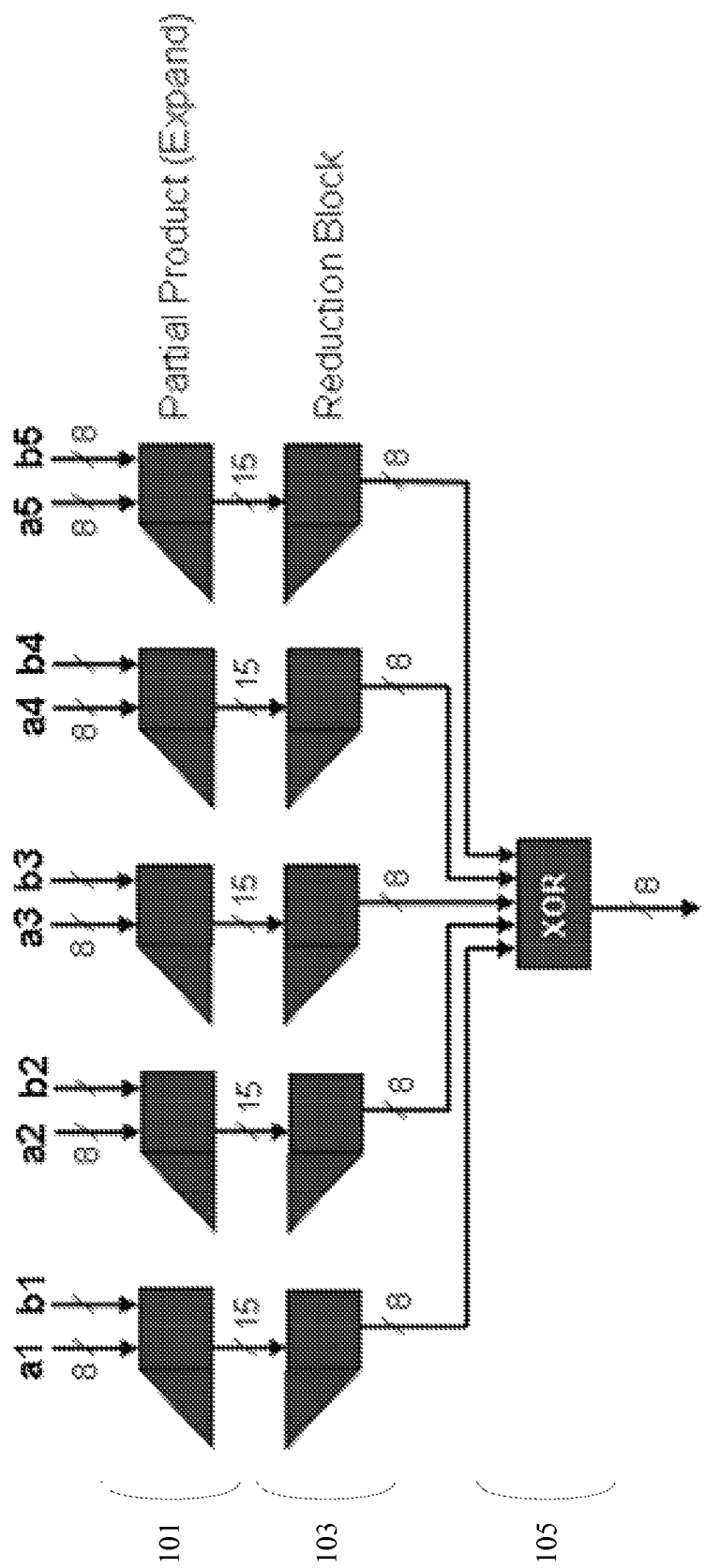
FIG. 1 illustrates one example of a finite field vector multiplier.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable chips including Field Programmable Gate Arrays (FPGAs). However, it should be noted that the techniques of the present invention can be applied to a number of different devices including Application Specific Integrated Circuits (ASICs) and Application Specific Standard Product (ASSPs). In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Overview

Parallel Reed Solomon error correction can be performed using dot products in finite fields while factoring out multiplier reduction. A finite field accumulator with left and right shifts of the polynomial dot products is used to generate the final result using a fixed dot product core and a small number of post processing Galois Field multiplies. An efficient Reed Solomon decoder for transmission, storage, and processing operations can be implemented in a small area while being easily scalable.

Example Embodiments

Communications, storage, and processing demands require ever more efficient error correction. Existing Reed Solomon error correction solutions are limited or non-existent, particularly for next generation communications applications on programmable chips. Error correction solutions using other algorithms such as low-density parity-check code (LDPC) require substantial resources. Consequently, the techniques and mechanisms of the present invention provide an efficient Reed Solomon decoder that is relatively small while remaining easily scalable.

According to various embodiments, an efficient mechanism of combining large groups of parallel finite field elements is provided. In particular embodiments, the mechanisms can be used for high performance Reed Solomon decoding, where multiple symbols need to be processed in a single clock. An extension of this mechanism will be used for syndrome calculation.

For simplicity, finite field operations will be described using the polynomial basis. Multiplication of two numbers in the finite field requires polynomial multiplication, and then reduction by the irreducible polynomial defining the field.

According to various embodiments, for a field in $GF(2^m)$, an element $a(x)$ can be defined as follows:

$$a(x) = \sum_{i=0}^{m-1} a_i x^i \quad \text{(Equation 1)}$$

where $a_i$ represents a single bit position in $a(x)$.

Assuming $$a(x), b(x), c(x), p(x) \in GF(2^m) \quad \text{(Equation 2)}$$

where $p(x)$ is an irreducible polynomial;

then $$c(x)=a(x)\cdot b(x) \bmod p(x) \quad \text{(Equation 3)}$$

The intermediate expansion of a(x)b(x) will create a polynomial of degree (2m−2), having (2m−1) elements. The partial product generation can be done using AND gates, and the partial products summed using XOR gates.

A variety of mechanisms are available for modulo reduction. For example, if the most significant bit position of the expanded polynomial is '1', then the irreducible polynomial is added to it (left shifted so that the most significant bit in the irreducible polynomial is aligned with the most significant bit of the expanded polynomial). After addition, the expanded polynomial will now be degree (2m−3). This process is repeated (m−1) times, until the expanded polynomial is degree (m−1), and can be represented in the original field.

In another example, each bit position of the expanded polynomial can be expressed in terms of the original field. A single bit will in the expanded polynomial of greater degree than (m−1) will generally result in multiple bit positions in the 0 to (m−1) positions. These polynomials can be precalculated, by reducing each bit position with the irreducible polynomial. The advantage of this system is that all of the terms in the reduced matrix can be calculated at once, without the iterative steps of method 1. All of the terms are then added, column by column, using XORs.

A very rough approximation is that both the generation and reduction of the expanded polynomial are approximately the same order of resources.

According to various embodiments, vector dot product can be used for modulo reduction. According to various embodiments, it is recognized that the associative nature of the expanded polynomials can be exploited. Rather than adding (using XORs in the finite fields) all of the multiplier results together, the expanded polynomials are added together. This will require about twice the logic that the addition of the multiplier results (reduced polynomials), but only one reduction circuit is then needed. This will save approximately half the resources in the vector operator.

In particular embodiments, the dot product can be expanded into the syndrome calculation. The syndrome calculation is the first step of the decoding operation. For a received codeword with the following symbols:

$$v(x)=c(x)+e(x)=v_0+v_1 x+v_2 x^2 \ldots +v_{n-1}x^{n-1} \quad \text{(Equation 4)}$$

The syndromes are calculated as:

$$S_j = v(\alpha^j) = \sum_{i=0}^{n-1} v_i \alpha^{ij}, \, j=1, 2 \ldots (n-k) \quad \text{(Equation 5)}$$

The symbols are received in order (n−1) down to 0. For this parallel decoder, the codeword is split into VECTORSIZE groups of symbols. For a maximal length codeword (the most common case), where $$n=2^m-1 \quad \text{(Equation 6)}$$

One of the groups will have one symbol missing. Some shortened codewords (where n and VECTORSIZE are chosen to have common factors), then each group can have the same number of symbols. Other codewords may be required where the last group has very few symbols. VHDL code is provided as follows:

gma: FOR k IN 1 TO vectorsize-1 GENERATE
cma: gfpartial
GENERIC MAP
(width=>width,multvalue=>powernum(startpower*(vectorsize-k) mod 255))
PORT MAP (aa=>symbolsff(k)(width DOWNTO 1),cc=>pp(k)(2*width-1 DOWNTO 1));
END GENERATE;
pp(vectorsize)(2*width-1 DOWNTO 1)<=zerovec & symbolsff(vectorsize)(width DOWNTO 1);

The POWERNUM vector contains powers of the first field root (generally 2). STARTPOWER is equivalent to j in the syndrome equation (6). The first element in the group is multiplied by the (VECTORSIZE-1)th power of the first element of the field. The mod value is the field size, or $2^m-1$. When m=8, the field size is 255. The last element in the group is just added to the group—equivalent to multiplying by the first field element to the power of 0.

The next group of symbols is again multiplied by the same vector of powers. The previous group result is multiplied by a single element, which is the first element to the power of VECTORSIZE (again modulo the number of field element to keep the element in the field). The VHDL for this operation is:

mulbbvalue<=conv_std_logic_vector (powernum(startpower*vectorsize mod 255),8);
cmul: gfmul
GENERIC MAP (width=>width, polynomial=>polynomial)
PORT MAP (aa=>sumvector,bb=>mulbbvalue, cc=>accumulatenode);

The current dot product is accumulated with the product of previous dot product and mulbbvalue. The sumvector is the reduction of the expanded polynomial from the dot product calculation. The multiplication by mulbbvalue has the effect of shifting the result of the dot product, as if each field element in the dot product was shifted by that power.

This process continues until all groups have been processed. The last group is not multiplied by mulbbvalue.

$$\alpha^j \quad \text{(Equation 7)}$$

In fact, entire sequence of received symbols will in effect have been left shifted by one position. The final dot product result (from the accumulator) can be corrected by simply dividing by the first field element, or multiplying by its inverse:

$$\alpha^{-j} \quad \text{(Equation 8)}$$

This can be efficiently implemented as a finite field multiply by a constant.

For the variable length Reed Solomon decoder, in one embodiment, a list of inverse field elements can be stored in a local memory, and the index into the memory is the number of symbols processed in parallel, minus the number of elements in the codeword modulo the number of symbols processed in parallel.

FIG. 1 shows the typical technique of building a finite field vector multiplier. The example shown is for the common field size of 8 bits. According to various embodiments, two 8 bit operands are input into each multiplier at 101. Partial products are generated by ANDing one operand with one bit of another operand, and shifting the resulting vector by the rank of the multiplier bit. At 103, this will create a network or matrix of partial products with a width of 2*field size−1, or 15 in the example case. The matrix of partial products is then added (using column by column XORs) at 105 to make a single number. The resulting number is then reduced to create a number of separate products.

For example, if the most significant bit position of the expanded polynomial is '1', then the irreducible polynomial is added to it (left shifted so that the most significant bit in the irreducible polynomial is aligned with the most significant bit of the expanded polynomial). After addition, the expanded polynomial will now be degree (2m−3). This process is repeated (m−1) times, until the expanded polynomial is degree (m−1), and can be represented in the original field.

Figure 2:
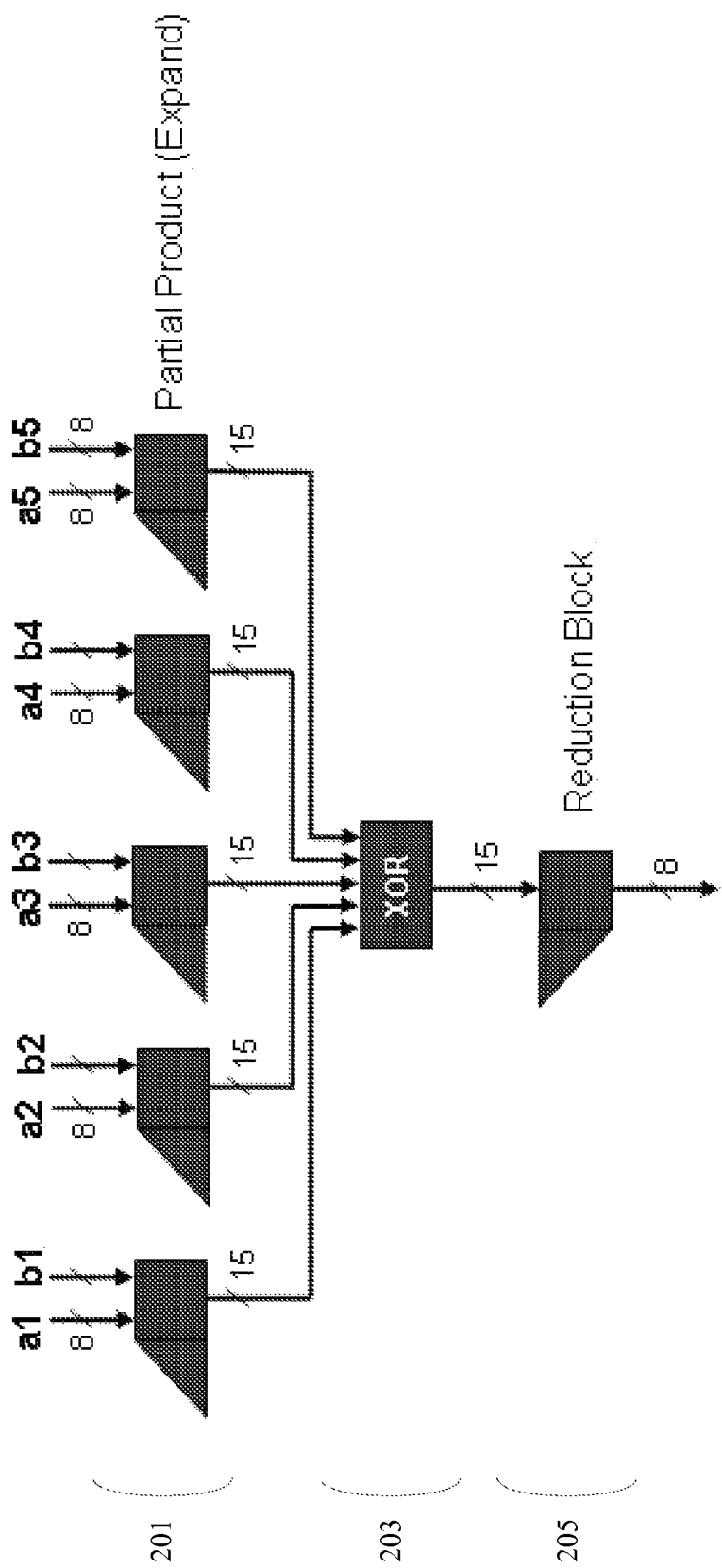
FIG. 2 illustrates another example of a finite field vector multiplier.

FIG. 2 illustrates a technique for building an improved finite field vector multiplier according to various embodiments. According to various embodiments, the partial products are generated and summed at 201. In particular embodiments, the results of the partial products are then all added together using a column by column XOR at 203. The single resulting number is then reduced using a single reduction circuit at 205. Rather than adding (using XORs in the finite fields) all of the multiplier results together, the expanded polynomials are added together. This will require about twice the logic that the addition of the multiplier results (reduced polynomials), but only one reduction circuit is then needed. This will save approximately half the resources in the vector operator.

This improved vector multiplier can then be used to build a more efficient parallel syndrome calculator.

Figure 3:
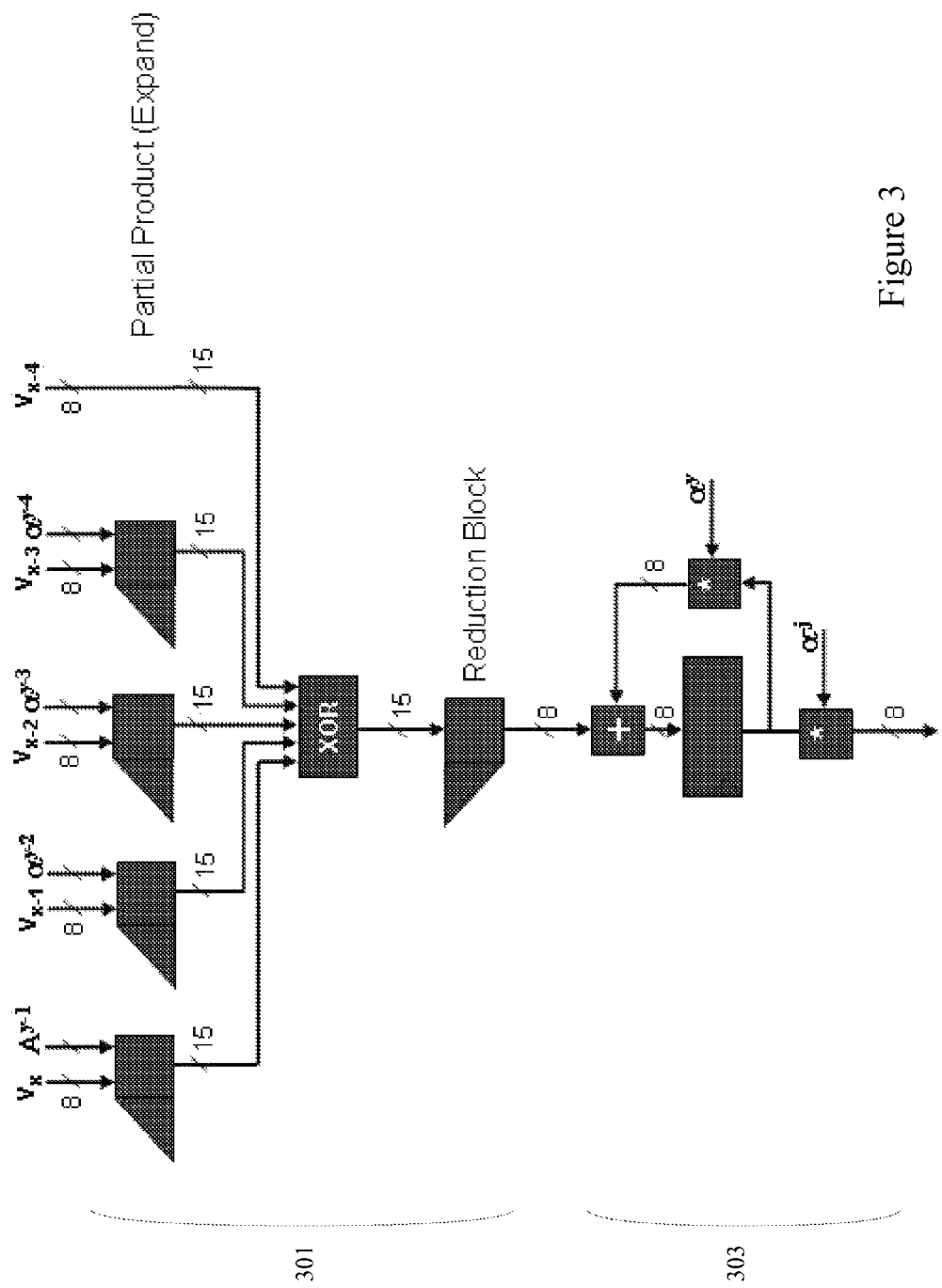
FIG. 3 illustrates one example of a syndrome calculator.

FIG. 3 illustrates one example of a parallel syndrome calculator. Some number of received codeword symbols is input into the circuit in parallel at 301. The number of symbols input in parallel is the VECTORSIZE. The first received symbol is multiplied by the power of the index of the syndrome multiplier by (VECTORSIZE−1), the next one by (VECTORSIZE−2), and so on. At 303, the result of this vector operation is added to the previous vector operation that is first multiplied by the first field element to the power one greater than the largest power in the vector.

Figure 4:
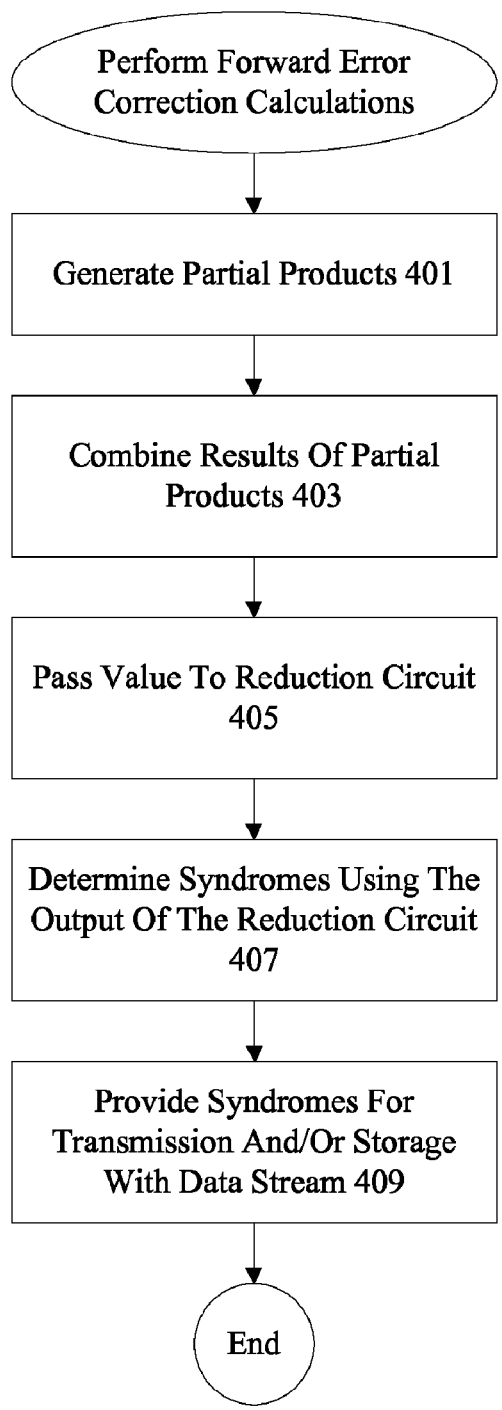
FIG. 4 illustrates a technique for using a finite field vector multiplier.

FIG. 4 illustrates a technique for calculating forward error correction codes. According to various embodiments, a data stream is received. At 401, partial products are generated using the data stream. At 403, results of the partial products are combined. In particular embodiments, the results are combined using a column by column XOR. The result is then passed at 405 to a reduction circuit. At 407, syndromes are determined using the resulting values from the reduction circuit. According to various embodiments, syndromes are provided for transmission, storage, and/or processing with a data stream at 409.

Figure 5:
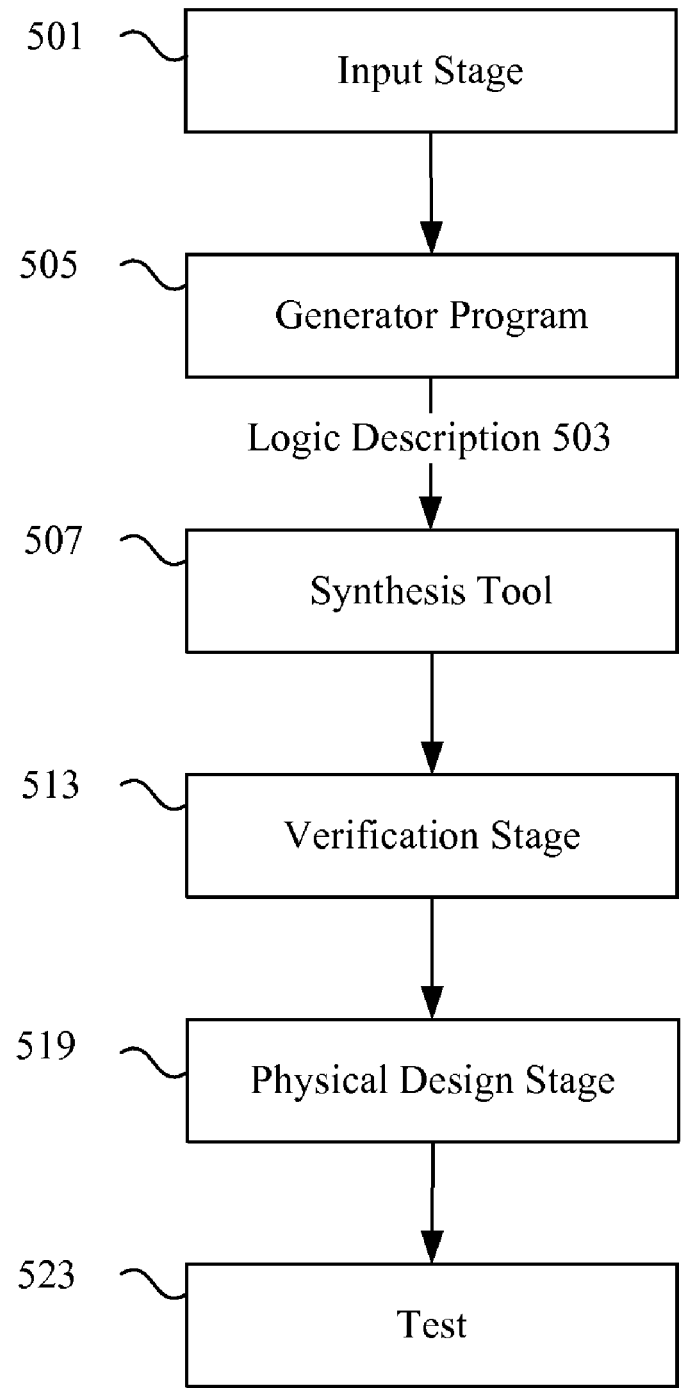
FIG. 5 illustrates one example of a design flow implementing a finite field vector multiplier.

FIG. 5 is a diagrammatic representation showing implementation of an electronic device having a forward error correction encoder/decoder. Although the techniques and mechanisms of the present invention can be implemented on a variety of devices, applications are particularly useful in the context of programmable logic. An input stage 501 receives selection information typically from a user for logic such as a processor core as well as other components to be implemented on an electronic device. In one example, the input received is in the form of a high-level language program. A generator program 505 creates a logic description 503 and provides the logic description along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of variable or fixed latency support. In some examples, components provided to an input stage include intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 509.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool typically locates logic cells on specific logic elements of a target hardware device and connects wires between the inputs and outputs of the various logic elements in accordance with logic required to implement an electronic design. The device can also be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
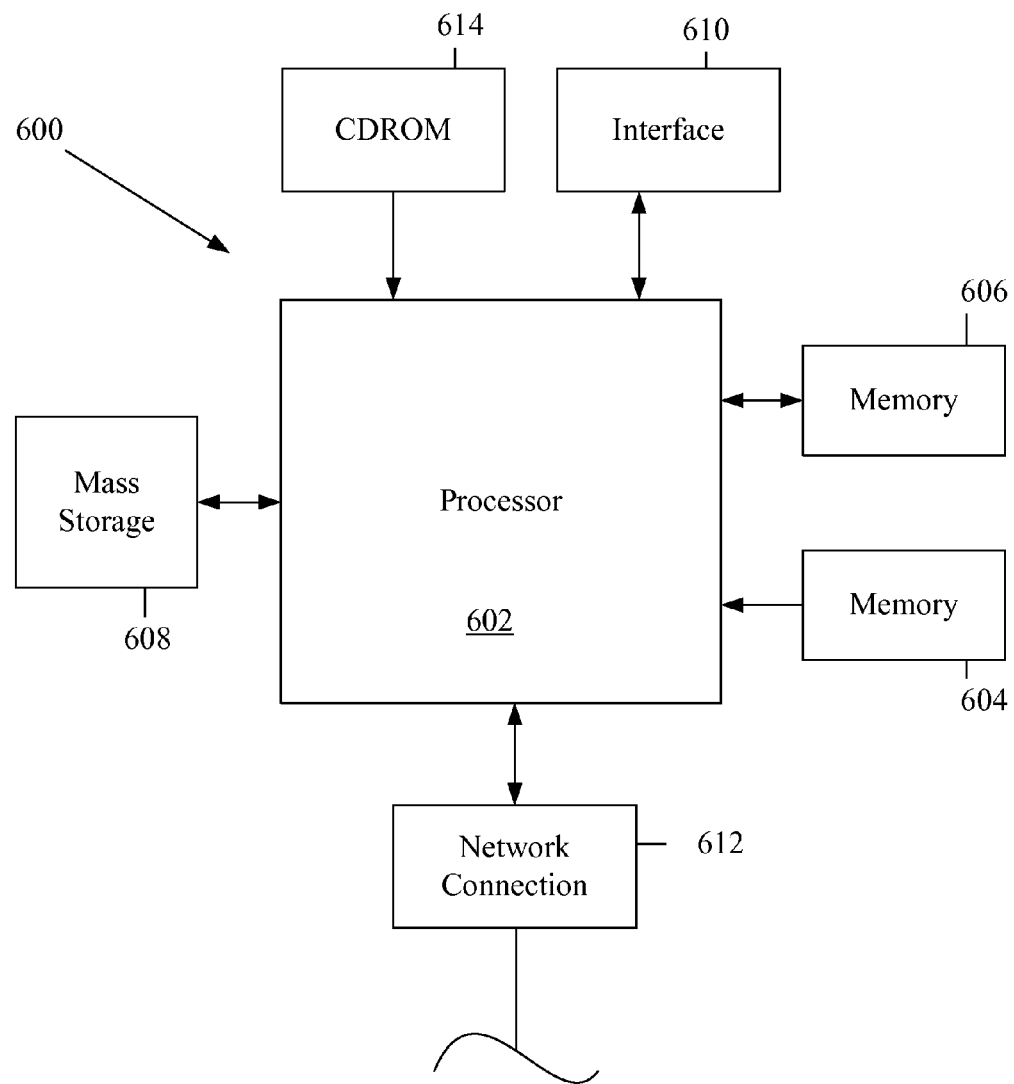
FIG. 6 illustrates one example of a computer system that can be used.

FIG. 6 is a diagrammatic representation showing a typical computer system that can be used to implement a programmable chip having distinct cryptographic components, such as red and black isolation. The computer system 600 includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate an electronic design. As is well known in the art, memory 604 acts to transfer data and instructions uni-directionally to the CPU and memory 606 is used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network connection as shown generally at 612. With such a network connection, it is contemplated that the CPU might receive information from the network, or might output information to the network in the course of performing the above-described process steps. It should be noted that the system 600 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of master and slave components and should not be restricted to the ones mentioned above. It is therefore intended that the invention be interpreted to include all variations and equivalents that fall within the true spirit and scope of the present invention.

What is claimed is:

1. A finite field vector calculation circuit, comprising:
   an interface configured to receive a codeword associated with a data stream and split the codeword into a plurality of symbols;
   a plurality of multiplication circuits configured to receive the plurality of symbols and generate a plurality of expanded polynomials;
   an exclusive OR (XOR) circuit configured to combine the plurality of expanded polynomials to generate an XOR output and forward said XOR output to a reduction circuit, wherein the reduction circuit performs a modulo reduction of the XOR output to generate a plurality of separate products.

2. The finite field vector calculation circuit of claim 1, wherein the separate products are used to generate forward error correction codes.

3. The finite field vector calculation circuit of claim 1, wherein the separate products are used to implement a Reed Solomon decoder.

4. The finite field vector calculation circuit of claim 1, wherein the plurality of multiplication circuits receive the plurality of symbols in parallel.

5. The finite field vector calculation circuit of claim 4, wherein the plurality of symbols are input in sequential order and the time/frequency shift within the codeword is provided by finite field multiplication by powers of the field.

6. The finite field vector calculation circuit of claim 5, wherein a vector result is shifted by a multiplication of a field power greater than the largest field power in the vector calculation, before finite field addition to the next vector result.

7. The finite field vector calculation circuit of claim 1, wherein if the number of elements in the codeword is not an even multiple of the number of symbols input to the vector, the final vector accumulation is shifted by the modulo difference of a codeword size and a vector size.

8. The finite field vector calculation circuit of claim 7, wherein the final vector accumulation is shifted by a finite field division of a power equal to the modulo difference.

9. The finite field vector calculation circuit of claim 7, wherein the final vector accumulation is shifted by a multiplication of the inverse power of this modulo difference.

10. The finite field vector calculation circuit of claim 7, wherein the entire codeword is shifted by the modulo difference by inserting the modulo difference number of "0" element before the codeword.

11. The finite field vector calculation circuit of claim 1, wherein the codeword is fixed size.

12. The finite field vector calculation circuit of claim 1, wherein the codeword is variable size.

13. The finite field vector calculation circuit of claim 12, wherein possible shift values for the variable size codeword are maintained in a table.

14. A syndrome calculation circuit, comprising:
multiplication circuitry configured to combine a plurality of operands associated with a data stream to generate a plurality of expanded polynomials;
an exclusive OR (XOR) circuit configured to combine the plurality of expanded polynomials multiplier results to generate an XOR output and forward said XOR output to a reduction circuit, wherein the reduction circuit performs a modulo reduction of the XOR output to generate a plurality of separate products used for syndrome calculation.

15. The syndrome calculation circuit of claim 14, wherein the syndromes are provided for a Reed Solomon Forward Error Correction (FEC) decoder.

16. The syndrome calculation circuit of claim 14, wherein the apparatus is implemented on a programmable chip.

17. The syndrome calculation circuit of claim 15, wherein the reduction circuit is connected to the output of the XOR circuit.

18. The syndrome calculation circuit of claim 14, wherein multiplication circuitry comprises a plurality of partial product multipliers coupled to a single XOR circuit coupled to a single reduction circuit.

* * * * *